United States Patent [19]

Kanazawa et al.

[11] Patent Number: 5,338,643
[45] Date of Patent: Aug. 16, 1994

[54] O-QUINONEDIAZIDE PHOTOSENSITIVE COMPOSITION CONTAINING S-TRIAZINE COMPOUND, NOVOLAK RESIN, VINYL-BASED POLYMER AND A DYE

[75] Inventors: Daisuke Kanazawa; Mitsuru Sasaki; Toshiyuki Urano, all of Yokohama; Youko Yamashita, Hino; Shinichi Matsubara, Hachiouji, all of Japan

[73] Assignees: Mitsubishi Kasei Corporation; Konica Corporation, both of Tokyo, Japan

[21] Appl. No.: 995,708

[22] Filed: Dec. 23, 1992

[30] Foreign Application Priority Data

Dec. 25, 1991 [JP] Japan ................ 3-343664

[51] Int. Cl.$^5$ ............................. G03F 7/023
[52] U.S. Cl. ..................... 430/190; 430/165; 430/191; 430/192; 430/193; 430/281; 430/292; 430/340; 430/343; 430/344
[58] Field of Search ............ 430/191, 192, 193, 340, 430/343, 344, 190, 281, 292, 165

[56] References Cited

U.S. PATENT DOCUMENTS 3,954,475  5/1976  Bonham et al. .
3,987,037  10/1976  Bonham et al. .
4,160,671  7/1979  Stahlhofen .
4,350,753  9/1982  Shelnut et al. ............ 430/191
4,458,000  7/1984  Stahlhofen .

FOREIGN PATENT DOCUMENTS 0362778   4/1990   European Pat. Off. .
50-55406  5/1975   Japan .
60-88942  5/1985   Japan .
4-328551  11/1992  Japan .

Primary Examiner—Charles L. Bowers, Jr.
Assistant Examiner—Christopher G. Young
Attorney, Agent, or Firm—Oblon, Spivak, McClelland, Maier & Neustadt

[57] ABSTRACT

Disclosed herein is a photosensitive composition comprising:

(A) 5 to 60 wt % of an o-quinonediazide compound;
(B) 0.05 to 10 wt % of an s-triazine compound
(C) 0.01 to 10 wt % of a dye for changing the color tone by the interaction with the photodecomposition product of the said s-triazine compound;
(D) 30 to 90 wt % of a novolak resin containing less than 5 wt % of phenols; and
(E) 1 to 60 wt % of a vinyl-based polymer having at least a phenolic hydroxyl group.

17 Claims, No Drawings

O-QUINONEDIAZIDE PHOTOSENSITIVE COMPOSITION CONTAINING S-TRIAZINE COMPOUND, NOVOLAK RESIN, VINYL-BASED POLYMER AND A DYE

BACKGROUND OF THE INVENTION

The present invention relates to a photosensitive composition. More particularly, the present invention relates to a photosensitive composition containing an o-naphthoquinonediazide compound, which is suitable for the production of lithographic printing plate, letterpress printing plate, IC, photomask, etc., which is capable of producing a visible image immediately after exposure, and which is excellent in sensitivity, image visibility after exposure, ball-point pen resistance, and chemical resistance.

Light-sensitive compositions containing an ester compound of o-naphthoquinonediazide sulfonate and a novolak resin as a photosensitive composition have been widely used for industrial production of lithographic printing plates and photoresists. These photosensitive compositions containing o-naphthoquinonediazide compound, however, have the following defects.

After the exposing operation under a yellow safety lamp, photosensitive o-naphthoquinonediazides having a yellow color become a colorless or pale yellow photodissociated component in which the yellow color is faded, but it is difficult to distinguish the exposed area from the unexposed area. For this reason, it is difficult or impossible for a platemaker to know whether or not a plate has been exposed when the work is suspended in the process of exposing a multiplicity of plates at the same time. Similarly, when a large plate is exposed many times in what is called a photocomposing method, for example, for making a lithographic printing plate, the platemaker cannot confirm what part has been exposed. For this reason, an operational miss is often caused, thereby greatly lowering the working efficiency.

The following arts of forming a visible image immediately after exposure by using a photosensitive composition, in other words, the arts for improving the above-described defects and imparting the image visibility after exposure to a photosensitive composition by using various materials, are known.

For example, U.S. Pat. Nos. 2,066,913 disclose a composition of using various reducible salts in the form of a mixture with a diazo compound; Japanese Patent Publication (KOKOKU) No. 2203/1965 discloses a photosensitive sheet for forming a visible image after exposure by using a photosensitive diazo compound and a basic indicator; Japanese Patent Publication (KOKOKU) No. 3041/1974 discloses a photosensitive composition comprising a positive-working diazo resin and a merocyanine dye; Japanese Patent Publication (KOKOKU) No. 21093/1965 discloses a printing original plate which is imparted with photosensitivity in advance by o-naphthoquinonediazide and which contains in the photosensitive layer an organic coloring agent for changing the tone when the pH is 2.5 to 6.5: Japanese Patent Publication (KOKOKU) No. 36209/1975 discloses a photosensitive copying layer containing o-naphthoquinonediazide sulfonate or o-naphthoquinonediazide sulfamide in which o-naphthoquinonediazide-4-halogenide sulfonate is 10 to 75 wt % and an organic compound having a salt formability as a dye is 1 to 50 wt % both based on the total content of the o-naphthoquinonediazide compound; and Japanese Patent Application Laid-Open (KOKAI) No. 62444/1980 discloses a photosensitive composition which contains an ester compound of phenol substituted by an electron absorbing substituent and o-naphthoquinonediazide-4-sulfonate, and an organic dye for changing the color tone by the interaction with a photodecomposition product of the o-naphthoquinonediazide-4-sulfonate compound.

The image visibility after exposure of the photosensitive compositions mentioned above, however, is still insufficient. In addition, the image visibility after exposure is lowered with passage of time too much for practical use.

The photosensitive compositions containing a halomethyloxadiazol compound as described in Japanese Patent Laid-Open Nos. 74728/1979 and 77742/1980 and a photosensitive composition containing a halomethyl-s-triazine compound and a color-changing agent which changes the color tone by the interaction with the photodecomposition product of the compound as described in Japanese Patent Application Laid-Open (KOKAI) Nos. 36281/1973 and 32070/1980 have recently become widespread because they can form a distinct visible image immediately after exposure and they are excellent in the stability with passage of time. In Japanese Patent Application Laid-Open (KOKAI) NO. 88942/1985, a combination of 2-trichloromethyl-5-(p-methoxystyryl)-1,3,4-oxadiazol and an organic acid, and a combination of 2,4-bis-(trichloromethyl)-6-p-methoxystyryl-s-triazine and an organic acid as components of photosensitive compositions are disclosed.

These photosensitive compositions, however, are also insufficient in the image visibility after exposure, especially, when the exposure is small. On the other hand, if the amount of visible image forming agent added is increased in order to enhance the image visibility after exposure, the sensitivity is unfavorably lowered.

A photosensitive composition is also required to have resistance to various chemicals used at the time of printing, for example, a counter-etching agent and a plate cleaner (the resistance will be referred to as "chemical resistance" hereinunder), and it is known that the chemical resistance of a photosensitive composition is improved by adding a vinyl polymer having a phenol hydroxyl group or a derivative thereof to the photosensitive composition.

Addition of a vinyl polymer having a phenol hydroxyl group, however, inconveniently lowers the image visibility after exposure and the sensitivity.

Another conventional problem is as follows. At the time of photocomposing, due to register of the film-manuscript, the position of the manuscript is marked on the photosensitive layer with a ball-point pen using oily ink. At this time, the solvent of the ink of the ball-point pen seems to erode the photosensitive layer, and after development, the mark appears at the image area and further on the printed sheet.

A photosensitive composition having a photosensitive layer which is hard to erode by the ink solvent of a ball-point pen (hereinunder referred to as "ball-point pen resistance") is, therefore, strongly demanded.

As described above, various means for satisfying the demands on a photosensitive composition have been proposed. However, if one requirement is met, another cannot be satisfied. It is thus difficult to keep a plurality of required properties with good balance.

As a result of various studies undertaken by the present inventors so as to solve the above-described technical problems and to provide a photosensitive composition which satisfies all the properties required such as sensitivity, image visibility after exposure, chemical resistance and ball-point pen resistance without sacrificing any of the properties, it has been found that a photosensitive composition containing a quinonediazide compound, an s-triazine compound having a specific skeleton, a dye for changing the tone by the interaction with a photodecomposition product, and two resins, namely, a novolak resin having a specific composition and a vinyl polymer having a specific skeleton is excellent in image visibility after exposure, especially when the exposure is small sensitivity, chemical resistance and ball-point pen resistance. On the basis of this finding, the present invention has been achieved.

SUMMARY OF THE INVENTION

It is an object of the present invention to provide a photosensitive composition which satisfies sensitivity, image visibility after exposure, chemical resistance and ball-point pen resistance.

It is another object of the present invention to provide a photosensitive composition which is more excellent in image visibility after exposure.

It is still another object of the present invention to provide a photosensitive composition which is more excellent in image visibility after exposure even when the exposure is small.

It is a further object of the present invention to provide a photosensitive composition which is more excellent in image visibility after exposure while maintaining any of the properties required at an adequate level.

It is a still further object of the present invention to provide a photosensitive composition which has a image visibility after exposure and which is more excellent in ball-point pen resistance.

It is a still further object of the present invention to provide a photosensitive composition with the reduced amount of unpolymerized phenols so as to be suitable for environmental protection and the protection of the working environment.

To achieve these aims, in an aspect of the present invention, there is provided a photosensitive composition comprising:

(A) an o-quinonediazide compound;
(B) an s-triazine compound represented by the following general formula (I):

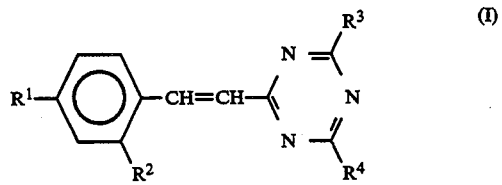

(wherein $R^1$ and $R^2$ each represent an alkyl group, a substituted alkyl group, an alkoxy group, a substituted alkoxy group or hydrogen atom, and $R^3$ and $R^4$ each represent a haloalkyl group having 1 to 4 carbon atoms or a haloalkenyl group having 1 to 4 carbon atoms);

(C) a dye for changing the color tone by the interaction with the photodecomposition product of (B);

(D) a novolak resin containing less than 5 wt % of unpolymerized phenols; and (E) a vinyl polymer having at least a phenolic hydroxyl group.

DETAILED DESCRIPTION OF THE INVENTION

In the photosensitive composition of the present invention, an o-quinonediazide compound, preferably an o-naphthoquinonediazide compound is used as a positive photosensitive material.

The o-naphthoquinonediazide compound preferably used in the present invention is not specified but a reaction product of a compound having an o-naphthoquinonediazide group and an alkali-soluble resin may be cited as an example.

The typical example of the reaction product of a compound having an o-naphthoquinonediazide group and an alkali-soluble resin is an ester compound of o-naphthoquinonediazide sulfonate and a polycondensated resin of a phenol and an aldehyde or a ketone.

Examples of the phenol used for the production of such an ester compound of o-naphthoquinonediazide sulfonate and a polycondensated resin of a phenol and an aldehyde or a ketone are a monovalent phenol such as phenol, o-cresol, m-cresol, p-cresol, 3,5-xylenol, carvacrol and thymol; a bivalent phenol such as catechol, resorcin and hydroquinone; a trivalent phenol such as pyrogallol and phloroglucin. As examples of the aldehyde, formaldehyde, benzaldehyde, acetaldehyde, crotonaldehyde and furfural may be cited. Among these, formaldehyde and benzaldehyde are preferable. As the ketone, for example, acetone and methyl ethyl ketone are usable.

Examples of the polycondensate resin are phenol-formaldehyde resin, m-cresol-formaldehyde resin, m-, p- mixed cresol-formaldehyde resin, resorcin-benzaldehyde resin, and pyrogallol-acetone resin.

These polycondensate resins of a phenol and an aldehyde or a ketone can be produced by a known method.

The condensation ratio of the compound having an o-naphthoquinonediazide group to an OH group of the phenol (the reaction ratio of the compound with respect to one OH group) is preferably 5 to 80%, more preferably 10 to 60%, still more preferably 10 to 40.

As an example of the reaction product of a compound having an o-naphthoquinonediazide group and an alkali-soluble resin may also be cited an ester compound of o-naphthoquinonediazide sulfonate and a vinyl polymer having an phenolic hydroxyl group.

As the vinyl polymer having an phenolic hydroxyl group which forms an ester, a vinyl polymer having a phenol hydroxyl group described in Japanese Patent Application laid-Open (KOKAI) No. 235950/1991 is usable. As the concrete examples of the vinyl polymer, a copolymer having at least one structural unit represented by the formula (II) to (VII) may be exemplified.

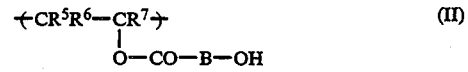

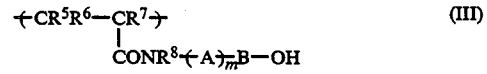

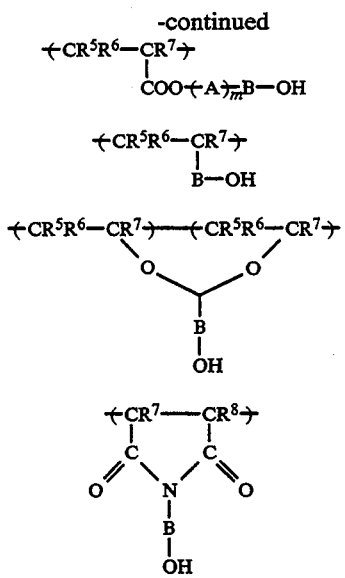

-continued $$\begin{array}{c} +CR^5R^6—CR^7 \rightarrow \\ | \\ COO+A \rightarrow_m B—OH \end{array} \quad (IV)$$

$$\begin{array}{c} +CR^5R^6—CR^7 \rightarrow \\ | \\ B—OH \end{array} \quad (V)$$

$$+CR^5R^6—CR^7 \rightarrow —+CR^5R^6—CR^7 \rightarrow \quad (VI)$$

(VII)

(wherein $R^5$ and $R^6$ each represent a hydrogen atom, a ($C_1$ to $C_4$)alkyl group or a carboxyl group, preferably a hydrogen atom; $R^7$ represents a hydrogen atom, a halogen atom or a ($C_1$ to $C_4$)alkyl group, preferably a hydrogen atom, a methyl group or an ethyl group; $R^8$ represents a hydrogen atom, a ($C_1$ to $C_4$)alkyl group, a ($C_6$ to $C_{10}$)aryl group or a ($C_7$ to $C_{11}$)aralkyl group, preferably a hydrogen atom; A represents an alkylene group which may have a substituent and connects a nitrogen atom or an oxygen atom and an aromatic carbon atom; m is an integer of 0 to 10, and B represents a phenylene group which may have a substituent or a naphthylene group which may have a substituent. When each of $R^5$, $R^6$, $R^7$ and $R^8$ is the alkyl group, the number of carbon atoms thereof is preferably 1 to 4, and it may either be a straight-chain or has a side chain, and when $R^7$ is a halogen atom, it is preferably a chlorine atom or a bromine atom.)

The vinyl polymer preferably has the structure of a copolymer. As the monomer unit which is combined with a structural unit represented by at least one of the general formulas (II) to (VII), the following vinyl monomers are usable. The vinyl monomers are, for example, unsaturated ethylene olefins such as ethylene, propylene, isobutylene, butadiene and isoprene; styrenes such as styrene, α-methylstyrene, p-methylstyrene and p-chlorostyrene; acrylic acids such as acrylic acid and methacrylic acid; unsaturated aliphatic dicarboxylic acids such as itaconic acid, iraconic acid, maleic acid and maleic anhydride; esters of α-methylene aliphatic monocarboxylic acid such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate and ethyl ethacrylate; nitriles such as acrylonitrile and methacrylonitrile; amides such as acrylamide; anilides such as acryl anilide, p-chloroacryl anilide, m-nitroacryl anilide and m-methoxyacryl anilide; vinyl esters such as vinyl acetate, vinyl propionate, vinyl benzoate and vinyl butylate; vinyl ethers such as methyl vinyl ether, ethyl vinyl ether, isobutyl vinyl ether and β-chlorobutyl vinyl ether; vinyl chloride; vinylidene chloride; vinylidene cyanide; ethylene derivatives such as 1-methyl-1-methoxy-ethylene, 1,1-dimethoxyethylene, 1,2-dimethoxyethylene, 1,1-dimethoxycarbonylethylene and 1-methyl-1-nitroethylene; and N-vinyl compounds such as N-vinylpyrrole, N-vinylcarbazole, N-vinylindole, N-vinylpyrrolidene and N-vinylpyrrolidone.

A condensate compound of a compound containing an o-naphthoquinonediazide group and 2,3,4-trihydroxybenzophenone, 2,3,4,4'-tetrahydroxybenzophenone, 2,3,4,2',4'-pentahydroxybenzophenone and 2,3,4, 3', 4',5'-hexahydroxybenzophenone are also usable.

In the present invention, the content of the quinonediazide compound (A) is generally 5 to 60 wt %, preferably 10 to 50 wt %, more preferably 15 to 40 wt % based on the total solids of the photosensitive composition except for the solvent.

In the present invention, as the s-triazine compound (B), a 2,4-bis(haloalkyl or haloalkenyl)-6-substituted styryl-s-triazine compound represented by the general formula (I) may be cited. The haloalkyl or haloalkenyl group of the s-triazine compound is substituted by one or more than one halogen atom. Such a triazine compound can be synthesized by a known method. For example, it is obtained by the condensation reaction of 2,4-bis(haloalkyl or haloalkenyl)-6-methyl-s-triazine with the corresponding aromatic aldehyde in accordance with the method described in U.S. Pat. No. 3,954,475. Examples of a preferred aldehyde are p-methoxybenzaldehyde, p-ethoxybenzaldehyde, p-propoxybenzaldehyde, p-butoxybenzaldehyde, p-pentyloxybenzaldehyde, p-methylbenzaldehyde, p-ethylbenzaldehyde, p-propylbenzaldehyde, p-butylbenzaldehyde, p-pentylbenzaldehyde, o-methoxybenzaldehyde, o-ethoxybenzaldehyde, o-propoxybenzaldehyde, o-butoxybenzaldehyde, o-pentyloxybenzaldehyde, o-methylbenzaldehyde, o-ethylbenzaldehyde, o-propylbenzaldehyde, o-butylbenzaldehyde, o-pentylbenzaldehyde, o,p-dimethoxybenzaldehyde, o,p-diethoxybenzaldehyde, o,p-dipropoxybenzaldehyde, o,p-dibutoxybenzaldehyde, o,p-dipentyloxybenzaldehyde, o,p-dlmethylbenzaldehyde, o,p-diethylbenzaldehyde, o,p-dipropylbenzaldehyde, o,p-dibutylbenzaldehyde and o,p-dipentylbenzaldehyde.

When the $R^1$ or $R^2$ represents an alkyl group or an alkoxy group in the formula (I), the number of carbon atoms of the (substituted) alkyl group or the (substituted) alkoxy group is preferably 1 to 4, and the carbon chain of the alkyl group or the alkoxy group may either be a straight chain or have a side chain. As the halogen atom contained in $R^3$ or $R^4$, a chlorine atom or a bromine atom is generally preferable, and the number of carbon atoms of the alkyl group or the alkenyl group is preferably 1 to 4. More preferably, each of $R^3$ and $R^4$ is a trihaloalkyl group or a trihaloalkenyl group. More preferably, each of $R^3$ and $R^4$ is a trichloromethyl group.

Among these, 2,4-bis trichloromethyl)-6-(p-alkoxystyryl)-s-triazine, 2,4-bis(trichloromethyl)-6-(p-alkylstyryl)-s-triazine, 2,4-bis(trichloromethyl)-6-(o,p-dialkylstyryl)-s-triazine and 2,4-bis(trichloromethyl)-6-(o,p-diakoxystyryl)-s-triazine are especially preferable.

Although typical examples of the s-triazine compound represented by the general formula (I) may be cited in the following, the s-triazine compound in the present invention is not restricted to these examples.

In the following examples, $R^1$ and $R^2$ each represent a hydrogen atom and $R^3$ and $R^4$ each represent a trichloromethyl group unless specified otherwise.

(I-1) $R^1$: methoxy group
(I-2) $R^1$: ethoxy group (I-3) $R^1$: propoxy group
(I-4) $R^1$: butoxy group
(I-5) $R^2$: methoxy group
(I-6) $R^2$: ethoxy group
(I-7) $R^2$: propoxy group
(I-8) $R^2$: butoxy group
(I-9) $R^1$ and $R^2$: methoxy group
(I-10) $R^1$ and $R^2$: ethoxy group
(I-11) $R^1$ and $R^2$: propoxy group
(I-12) $R^1$ and $R^2$: butoxy group
(I-13) $R^1$: methyl group
(I-14) $R^1$: ethyl group
(I-15) $R^1$: propyl group
(I-16) $R^1$: butyl group
(I-17) $R^2$: methyl group
(I-18) $R^2$: ethyl group
(I-19) $R^2$: propyl group
(I-20) $R^2$: butyl group
(I-21) $R^1$ and $R^2$:methyl group
(I-22) $R^1$ and $R^2$: ethyl group
(I-23) $R^1$ and $R^2$: propyl group
(I-24) $R^1$ and $R^2$: butyl group The amount of halomethyl s-triazine compound added is generally 0.05 to 10 wt %, preferably 0.1 to 5 wt % based on the total solids of the photosensitive composition.

As the dye (C) for changing the color tone by the interaction with the photodecomposition product of a compound which produces an acid or a free radical when an active beam is irradiated thereonto, there are two types, namely, one is a coupling dye, and the other is a fading or discoloring dye. As the fading or discoloring dye, diphenylmethane dyes, triphenylmethane dyes, thiazines dyes, oxazine dyes, xanthene dyes, anthraquinone dyes, iminonaphthoquinone dyes and azomethine dyes, for example, are effectively usable.

Examples of these dyes are Brilliant Green, Eosine, Ethyl Violet, Erythrocin B, Methyl Green, Crystal Violet, Basic Fuchsine, phenolphthalein, 1,3-diphenyltriazine, Alizarine Red S, Thymolphthalein, Methyl Violet 2B, Quinaldine Red, Rose Bengal, Methanyl Yellow, Thymolsurfophthalein, Xylenol Blue, Methyl Orange, Orange IV, Diphenylthiocarbazone, 2,7-dichlorofluorescein, Paramethyl Red, Congo Red, Benzopurpurine 4B, α-Naphthyl Red, Nile Blue 2B, Nile Blue A, Phenacetalene, Methyl Violet, Malachite Green, Parafuchsine, Victoria Pure Blue BOH (produced by Modogaya Chemical Co., Ltd.) , Oil Blue #603 (produced by Orient Kagaku Kogyo K. K.), Oil Pink #312 (produced by Orient Kagaku Kogyo K. K.), Oil Scarlet #308 (produced by Orient Kagaku Kogyo K. K.), Oil Red OG (produced by Orient Kagaku Kogyo K. K.), Oil Red RR (produced by Orient Kagaku Kogyo K. K.), Oil Green #502 (produced by Orient Kagaku Kogyo K. K.), Spiron Red BEH Special (produced by Hodogaya Chemical Co., Ltd.), m-Cresol Purple, Cresol Red, Rhodamine B, Rhodamine 6G, Fast Acid Violet R, Sulforhodamine B, Auramine, 4-p-diethylaminophenyliminonaphthoquinone, 2-carboxyanilino-4-p-diethylaminophenyliminonaphthoquinone, 2-carbosteary amino-4-p-dihydroxyethylaminophenyliminonaphthoquinone, p-methoxybenzoyl-p'-diethylamino-o'-methylphenyliminoacetoanylide, cyano-p-diethylaminophenliminoacetoanylide, 1-phenyl-3-methyl-4-p-diethylaminophenylimino-5-pyrazolone and 1-β-naphtyl-4-p-diethylaminophenylimino-5-pyrazolone.

As an example of the coupling dye, arylamines may be cited. The arylamines suitable for the present invention include a leuco pigment as well as arylamines such as a primary aromatic amine and a secondary aromatic amine.

Examples of these are diphenylamine, dibenzylarnine, triphenylamine, diethylaniline, diphenyl-p-phenylenediamine, p-toluidine, 4,4'-biphenyldiamine, o-chloroaniline, o-bromoaniline, 4-chloro-o-phenylenediamine, o-bromo-N,N-dimethylaniline, 1,2,3-triphenylguanidine, naphtylamine, diaatinodiphenylmethane, aniline, 2,5-dichloroaniline, N-methyldiphenylamine, o-toluidine, p,p'-tetraznethyldiaminodiphenylmethane, N,N-dimethyl-p-phenylenediamine, 1,2-dianilinoethylene, p,p',p''-hexamethyltriaminotriphenylmethane, p,p'-tetramethyldiaminotriphenylmethane, p,p'-tetramethyldiaminodiphenylmethylimine, p,p,p''-triamino-o-methyltriphenylmethane, p,p,p''-triaminotriphenylcarbinol, p,p'-tetraxnethylaminodiphenyl-4-anilinonaphtylmethane, p,p',p''-triaminotriphenylmethane and p,p',p''-hexapropyltriaminotriphenylmethane.

The amount of dye added is preferably 0.01 to 10 wt %, more preferably 0.02 to 5 wt % based on the total solids of the photosensitive composition. These dyes may be used either singly or in the form of a mixture.

The photosensitive composition of the present invention contains the two types of resins (D) and (E). The novolak resin (D) in the present invention is a resin obtained by the condensation of phenols and formaldehyde in the presence of an acid as a catalyst. As examples of the phenols may be cited phenol, o-cresol, m-cresol, p-cresol, 3,5-xylenol, 2,4-xylenol, 2,5-xylenol, carvacrol, thymol, catechol, resorcin, hydroquinone, pyrogallol and phloroglucin.

These phenols may be used either singly or in the form of a mixture so as to obtain resins by the condensation with formaldehyde. Preferred novolak resins are resins obtained by the copolymerization of at least one selected from the group consisting of phenol, m-cresol (or o-cresol) and p-cresol with formaldehyde.

Examples of these resins are a phenol-formaldehyde resin, an m-cresol-formaldehyde resin, an o-cresol-formaldehyde resin, a phenol-p-cresol-formaldehyde resin, an m-cresol-p-cresol-formaldehyde resin, an o-cresol-p-cresol-formaldehyde resin, a phenol-m-cresol-p-cresol-formaldehyde resin, and a phenol-o-cresol-p-cresol-formaldehyde resin. Among these novolak resins, a phenol-m-cresol-p-cresol-formaldehyde resin is preferable.

The novolak resin used in the present invention is ones containing only less than 5 wt % of the unpolymerized phenols which is used for the synthesis. Such a novolak resin can be obtained by synthesizing a novolak resin by a known method and, for example, heating the synthesized novolak resin under a reduced pressure.

These novolak resins may be used either singly or in the form of a mixture.

As the molecular weight (polystyrene standard) of the novolak resin, the weight-average molecular weight (Mw) is preferably in the range of $2.0 \times 10^3$ to $2.0 \times 10^4$ and the number-average molecular weight (Mn) is preferably in the range of $7.0 \times 10^2$ to $5.0 \times 10^3$. More preferably, the Mw is in the range of $3.0 \times 10^3$ to $6.0 \times 10^3$ and the Mn is in the range of $7.7 \times 10^2$ to $1.2 \times 10^3$.

The molecular weight of the novolak resin and the content of the unpolymerized phenol in the present invention were measured by gel permeation chromotography.

The amount of novolak resin which contains less than 5 wt % of the unpolymerized phenols is generally 30 to 90 wt %, preferably 50 to 90 wt % based on the total solids of the photosensitive composition.

As the vinyl poller (E) having a phenolic hydroxyl group in the present invention, a poller produced by the cleavage of a carbon and carbon double bond and the polymerization thereof, and having structural units represented by at least one of the following general formulas (II) to (VII), is preferably used.

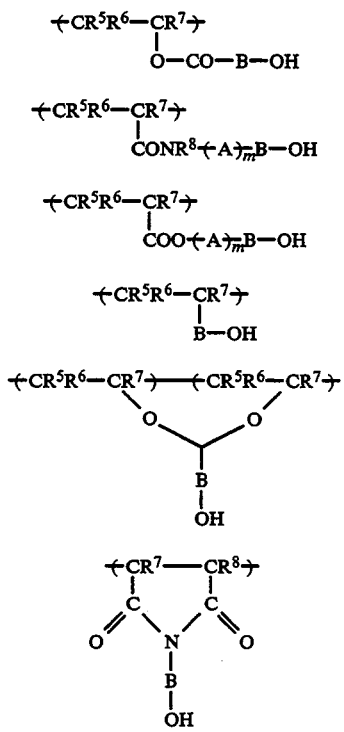

(wherein $R^5$ and $R^6$ each represent a hydrogen atom, a ($C_1$ to $C_4$)alkyl group or a carboxyl group, preferably a hydrogen atom; $R^7$ represents a hydrogen atom, a halogen atom or a ($C_1$ to $C_4$)alkyl group, preferably a hydrogen atom, a methyl group or an ethyl group; $R^8$ represents a hydrogen atom, a ($C_1$ to $C_4$)alkyl group, a ($C_6$ to $C_{10}$)aryl group or a ($C_7$ to $C_{11}$)aralkyl group, preferably a hydrogen atom; A represents an alkylene group which may have a substituent and connects a nitrogen atom or an oxygen atom and an aromatic carbon atom; m is an integer of 0 to 10, and B represents a phenylene group which may have a substituent or a naphthylene group which may have a substituent. When each of $R^5$, $R^6$, $R^7$ and $R^8$ is the alkyl group, the number of carbon atoms thereof is preferably 1 to 4, and it may either be a straight-chain or has a side chain, and when $R^7$ is a halogen atom, it is preferably a chlorine atom or a bromine atom.)

Among these, the vinyl polymer (E) in the present invention is preferably a copolymer containing at least one structural unit represented by the general formula (III).

The vinyl polymer (E) preferably has the structure of a copolymer. As the monomer unit which is combined with a structural unit represented by at least one of the general formulas (II) to (VII), unsaturated ethylchic olefins such as ethylene, propylene, isobutylene, butadiene and isoprene; styrenes such as styrene, α-methylstyrene, p-methylstyrene and p-chlorostyrene; acrylic acids such as acrylic acid and methacrylic acid; unsaturated aliphatic dicarboxylic acids such as iraconic acid, maleic acid and maleic anhydride; esters of α-methylene aliphatic monocarboxylic acid such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate and ethyl ethacrylate; nitriles such as acrylonitrile and methacrylonitrile; amides such as acrylamide; anilides such as acryl anilide, p-chloroacryl anilide, m-nitroacryl anilide and m-methoxyacryl anilide; vinyl esters such as vinyl acetate, vinyl propionate, vinyl benzoate and vinyl burylate; vinyl ethers such as methyl vinyl ether, ethyl vinyl ether, isobutyl vinyl ether and β-chlorobutyl vinyl ether; vinyl chloride; vinylidene chloride; vinylidene cyanide; ethylene derivatives such as 1-methyl-1-methoxy-ethylene, 1,1-dimethoxyethylene, 1,2-dimethoxyethylene, 1,1-dimethoxycarbonylethylene and 1-methyl-1-nitroethylene; and N-vinyl compounds such as N-vinylpyrrole, N-vinylcarbazole, N-vinylindole, N-vinylpyrrolidene and N-vinylpyrrolidone may be exemplified.

These vinyl-based monomers are present in a polymer in which the unsaturated double bond is cleaved.

Among these monomers which are combined with a structural unit represented by at least one of the general formulas (II) to (VII), (meth)acrylic acids, esters of aliphatic monocarboxylic acid and nitriles are preferable, because they exhibit synthetically excellent properties. Methacrylic acid, methyl methacrylate, acrylonitrile and ethyl acrylate are more preferable.

These monomers may be combined with the vinyl polymer either in the form of a block or a random polymer.

The content of the structural units represented by at least one of the general formulas (II) to (VII) is generally 5 to 70 mol %, preferably 10 to 40 mol %.

The weight-average molecular weight (Mw) of the vinyl polymer having a phenolic hydroxyl group or a derivative thereof is generally in the range of $5 \times 10^3$ to $1 \times 10^5$, preferably $1 \times 10^4$ to $7 \times 10^4$.

The amount of vinyl polymer having a phenolic hydroxyl group or a derivative thereof is generally in the range of 1 to 60 wt %, preferably 2 to 40 wt % based on the total solids of the photosensitive composition of the present invention.

Preferred examples of the vinyl polymer used in the present invention will be described in the following. In the following compounds, the Mw represents a weight-average molecular weight, the Mn a number-average molecular weight, s, k, l, o, m and n each represent the mol % of the corresponding structural units.

(a)

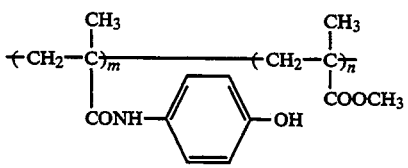

$$\begin{pmatrix} Mw = 28000, Mw/Mn = 7.8 \\ m{:}n = 40{:}60 \end{pmatrix}$$

-continued (b)
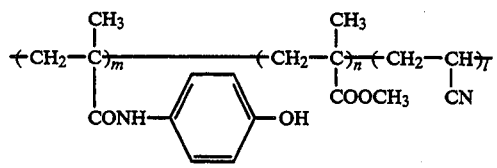
$$\left(\begin{array}{c} Mw = 22000, Mw/Mn = 6.9 \\ m:n:l = 30:40:30 \end{array}\right)$$

(c)
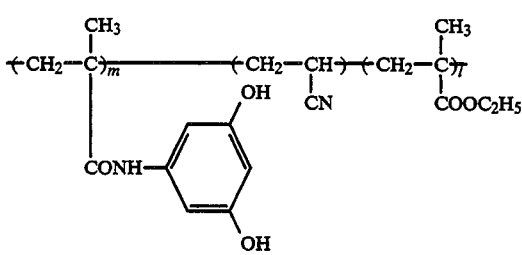
$$\left(\begin{array}{c} Mw = 33000, Mw/Mn = 3.1 \\ m:n:l = 20:35:45 \end{array}\right)$$

(d)
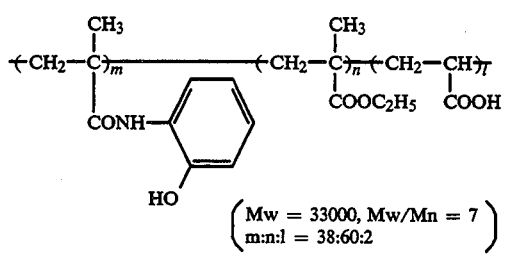
$$\left(\begin{array}{c} Mw = 33000, Mw/Mn = 7 \\ m:n:l = 38:60:2 \end{array}\right)$$

(e)
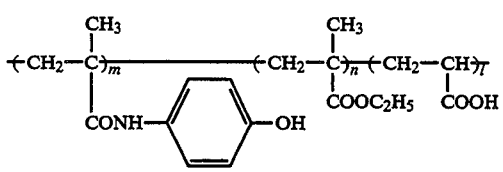
$$\left(\begin{array}{c} Mw = 33000, Mw/Mn = 7 \\ m:n:l = 38:60:2 \end{array}\right)$$

(f)
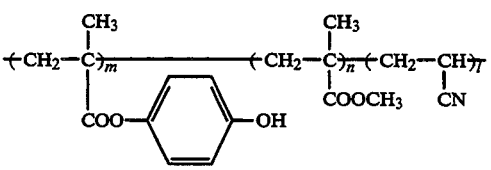
$$\left(\begin{array}{c} Mw = 40000, Mw/Mn = 3.5 \\ m:n:l = 20:60:20 \end{array}\right)$$

(g)
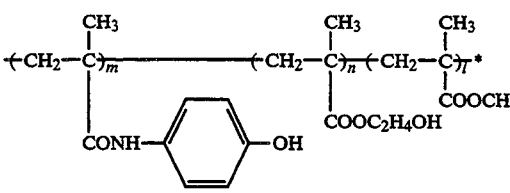

-continued

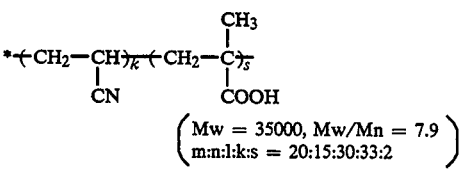
$$\left(\begin{array}{c} Mw = 35000, Mw/Mn = 7.9 \\ m:n:l:k:s = 20:15:30:33:2 \end{array}\right)$$

(h)
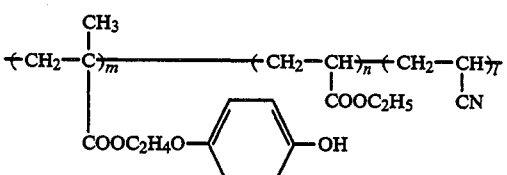
$$\left(\begin{array}{c} Mw = 35000, Mw/Mn = 3.5 \\ m:n:l = 30:30:40 \end{array}\right)$$

(i)
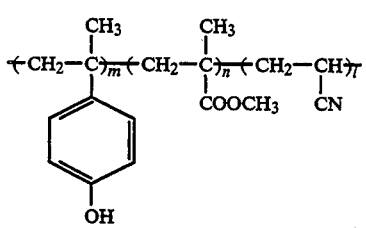
$$\left(\begin{array}{c} Mw = 54000, Mw/Mn = 8.2 \\ m:n:l = 20:40:40 \end{array}\right)$$

(j)
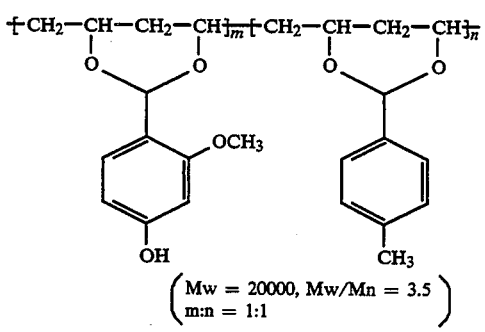
$$\left(\begin{array}{c} Mw = 20000, Mw/Mn = 3.5 \\ m:n = 1:1 \end{array}\right)$$

(k)
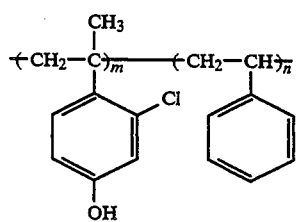
$$\left(\begin{array}{c} Mw = 51000, Mw/Mn = 5.7 \\ m:n = 1:1 \end{array}\right)$$

(l)

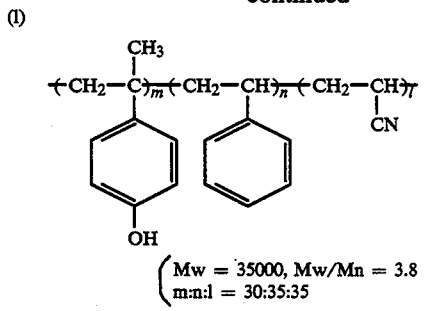

(m)

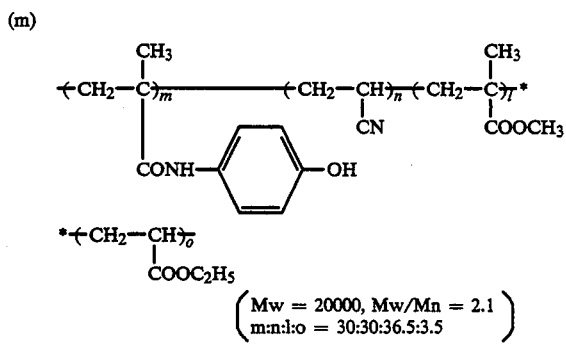

(n)

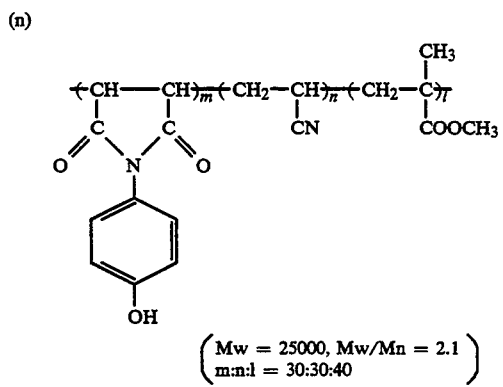

Among these, the vinyl polymers (a), (b), (e), (g) and (m) are preferable.

The photosensitive composition of the present invention may contain various alkali-soluble resins in addition to the novolak resin and the vinyl polymer having a phenolic hydroxyl group in the range which does not hinder the achievement of the object of the present invention. Such alkali-soluble resins are not specified, but vinyl-based copolymers having a carboxyl group and urethane resins having a carboxyl group may be cited.

Examples of the vinyl-based copolymers having a carboxyl group are vinyl copolymers which are synthesized with a monomer component having, for example, acrylic acids such as acrylic acid and methacrylic acid; and unsaturated aliphatic dicarboxylic acids such as iraconic acid, maleic acid and maleic anhydride; as an essential component. More particularly, as the monomer component of the vinyl-based copolymers having a carboxyl group, the following vinyl monomers are preferable. The vinyl monomers are unsaturated ethylenic olefins such as ethylene, propylene, isobutylene, butadiene and isoprene; styrenes such as styrene, α-methylstyrene, p-methylstyrene and p-chlorostyrene; esters of α-methylene aliphatic monocarboxylic acid such as methyl acrylate, ethyl acrylate, n-butyl acrylate, isobutyl acrylate, dodecyl acrylate, 2-chloroethyl acrylate, phenyl acrylate, methyl α-chloroacrylate, methyl methacrylate, ethyl methacrylate and ethyl ethacrylate; nitriles such as acrylonitrile and methacrylonitrile; amides such as acrylamide; imides such as N-phenylmaleinimide; anilides such as acryl anilide, p-chloroacryl anilide, m-nitroacryl anilide and m-methoxyacryl anilide; vinyl esters such as vinyl acetate, vinyl propionate, vinyl benzoate and vinyl butylate; vinyl ethers such as methyl vinyl ether, ethyl vinyl ether, isobutyl vinyl ether and β-chlorobutyl vinyl ether; vinyl chloride; vinylidene chloride; vinylidene cyanide; ethylene derivatives such as 1-methyl-1-methoxyethylene, 1,1-dimethoxyethylene, 1,2-dimethoxyethylene, 1,1-dimethoxycarbonylethylene and 1-methyl-1-nitroethylene; and N-vinyl compounds such as N-vinylpyrrole, N-vinylcarbazole, N-vinylindole, N-vinylpyrrolidene and N-vinylpyrrolidone. These vinyl monomers are present in a polymer in which the unsaturated double bond is cleaved.

Among these monomers, esters of aliphatic monocarboxylic acid and nitriles are especially preferably used.

These monomers may be bonded either in the form of a block or a random polymer.

The urethane resin having a carboxyl group is preferably a polyurethane resin having as a fundamental skeleton the reaction product of a diisocyanate compound represented by the following general formula (VIII) and a diol compound having a carboxylic group represented by the following general formula (IX) or (X).

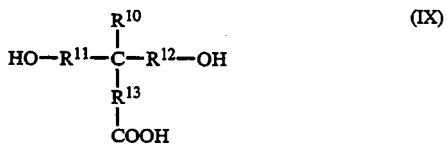

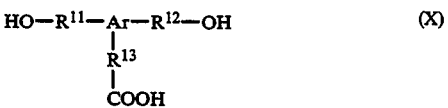

(wherein $R^9$ represents a bivalent ($C_1$ to $C_8$) aliphatic or ($C_6$ to $C_{15}$) aromatic hydrocarbon group which may have a substituent and $R^9$ may have, if necessary, another functional group which does not react with an isocyanate group such as ester group, urethane group, amide group and ureido group; $R^{10}$ represents a hydrogen atom or a ($C_1$ to $C_8$) alkyl, a ($C_7$ to $C_{12}$)aralkyl, a ($C_6$ to $C_{15}$)aryl, a ($C_1$ to $C_8$)alkoxy or a ($C_6$ to $C_{15}$)aryloxy group which may have a substituent, and $R^{10}$ preferably represents a hydrogen atom, an alkyl group having 1 to 8 carbon atoms or an aryl group having 6 to 15 carbon atoms; $R^{11}$, $R^{12}$ and $R^{13}$ may be either different or the same and each of them represents a bivalent aliphatic or aromatic hydrocarbon group which may have a single bond and a substituent, preferably $R^{11}$, $R^{12}$ and $R^{13}$ represent an alkylene group having 1 to 20 carbon atoms or an arylene group having 6 to 15 carbon atoms, more preferably an alkylene group having 1 to 8 carbon atoms, and $R^{11}$, $R^{12}$ and $R^{13}$ each may have, if necessary, another functional group which does not react with an isocyanate group, such as ester group, urethane group, amide group, ureido group and ether group; two or three of $R^{10}$, $R^{11}$, $R^{12}$ and $R^{13}$ in combination may form a ring; and Ar represents a trivalent ($C_6$ to $C_{15}$)aromatic hydrocarbon group which may have a substituent, preferably an aromatic group having 6 to 15 carbon atoms.)

Examples of the diisocyanate compound represented by the general formula (VIII) are aromatic diisocyanate compounds such as 2,4-tolylene diisocyanate, dimers of 2,4-tolylene diisocyanate, 2,6-trilene diisocyanate, p-xylylene diisocyanate, methaxylylene diisocyanate, 4,4-diphenylmethane diisocyanate, 1,5-naphthylene diisocyanate and 3,3'-dimethyl-biphenyl-4,4'-diisocyanate; aliphatic diisocyanate compounds such as hexamethylene diisocyanate, trimethylhexamethylene diisocyanate, lysine diisocyanate and dimer acid diisocyanate; alicyclic diisocyanate compounds such as isophorone diisocyanate, 4,4'-methylene-bis(cyclohexyl isocyanate), methylcyclohexane-2,4 (or 2,6)-diisocyanate and 1, 3-(isocyanate methyl) cyclohexane; a reaction product of 1 a diol and diisocyanate such as an addition product of 1 mol of 1,3-butylene glycol and 2 mol of tolylene diisocyanate.

Examples of the diol compound having a carboxyl group which is represented by the general formula (IX) or (X) are 3,5-dihydroxybenzoic acid, 2,2-bis(hydroxymethyl)propionic acid, 2,2-bis(hydroxyethyl)propionic acid, 2,2-bis(3-hydroxypropyl)propionic acid, 2,2-bis-(hydroxymethyl)-acetic acid, bis-(4-hydroxyphenyl)-acetic acid, 4,4-bis-(4-hydroxyphenyl)pentanoic acid and tartaric acid.

The polyurethane resin may be formed from two or more compounds produced from the diisocyanate compounds represented by the general formula (VIII) and the diol compounds having a carboxyl group and represented by the general formula (IX) or (X).

The amount of vinyl polymer having a carboxyl group or urethane resin having a carboxyl group added is not more than 60 wt %, preferably 0.1 to 50 wt % based on the total solids of the photosensitive composition.

As examples of the acid used in the present invention, the organic acids described in Japanese Patent Application Laid-Open (KOKAI) Nos. 88942/1985 and 137850/1990 and the inorganic acids described in "NEWLY EDITED KAGAKU BENRAN", compiled by NIHON KAGAKU KAI, pp. 92 to 158, (published by MARUZEN SHUPPAN) may be cited. Examples of the organic acids are sulfonic acids such as p-toluenesulfonic acid, dodecylbenzenesulfonic acid, mesitylenesulfonic acid, methanesulfonic acid, ethanesulfonic acid, benzenesulfonic acid, m-benzenedisulfonic acid; sulfinic acids such as p-toluenesulfinic acid, benzylsulfinic acid, methanesulfinic acid; phosphonic acids such as Phenylphosphonic acid, methylphosphonic acid, chloromethylphosphonic acid; aliphatic monocarboxylic acids such as formic acid, acetic acid, propionic acid, butylic acid, isobutylic acid, pentanoic acid, hexanoic acid and heptanoic acid; alicyclic monocarboxylic acids such as cyclohexanecarboxylic acid; and aromatic monocarboxylic acids such as benzoic acid, o-hydroxy benzoic acid, m-hydroxy benzoic acid, p-hydroxy benzoic acid, o-methoxy benzoic acid, m-methoxy benzoic acid, p-methoxy benzoic acid, o-methylbenzoic acid, m-methylbenzoic acid, p-methylbenzoic acid, 3,5-dihydroxybenzoic acid, phloroglucinbenzoic acid, gallic acid and 3,5-dimethylbenzoic acid. Saturated or unsatulated aliphatic dicarboxylic acids such as maloic acid, methylmaloic acid, dimethylmaloic acid, succinic acid, glutaric acid, adipic acid, pimelic acid, suberic acid, azelaic acid, sebacic acid, iraconic acid and malic acid; alicyclic dicarboxylic acids such as tetrahydrophthalic acid, 1,1-cyclobutanedicarboxylic acid, 1,1-cyclopentanedicarboxylic acid, 1,3-cyclopentanedicarboxylic acid, 1,1-cyclohexanedicarboxylic acid, 1,2-cyclohexanedicarboxylic acid and 1,3-cyclohexanedicarboxylic acid; and aromatic dicarboxylic acid such as phthalic acid, isophthalic acid and terephthalic acid are also usable.

Among these organic acids, sulfonic acids such as p-toluenesulfonic acid, dodecylbenzenesulfonic acid, mesitylenesulfonic acid, methanesulfonic acid, ethanesulfonic acid, benzenesulfonic acid and m-benzenedisulfonic acid are more preferable.

Examples of the inorganic acids are nitric acid, sulfuric acid, hydrochloric acid, silicic acid and phosphoric acid. Among these, sulfuric acid and phosphoric acid are more preferable.

The acid content is generally 0.05 to 5 wt %, preferably 0.1 to 3 wt % based on the total solids of the photosensitive composition.

The photosensitive composition of the present invention may contain, if necessary, another additive in addition to the above-described components. For example, the photosensitive composition of the present invention may contain a resin composed of a condensate of a substituted phenol and an aldehyde and/or an o-naphthoquinonediazide sulfonate compound thereof as a grease sensitizer in order to enhance the grease sensitivity of the photosensitive composition.

As the substituted phenol is used a phenol having at most 3 substituents $R^{14}$, $R^{15}$ and $R^{16}$, wherein $R^{14}$ and $R^{15}$ each represent hydrogen atom, an alkyl group having 1 to 4 carbon atoms or a halogen atom, and $R^{16}$ represents an alkyl group having not less than 2 carbon atoms, preferably 4 to 12 carbon atoms or a cycloalkyl group having 5 to 10 carbon atoms.

The content of the grease sensitizer is generally not more than 15 wt %, preferably 0.05 to 15 wt %, more preferably 0.5 to 5 wt % based on the total solids of the photosensitive composition.

It is also possible to add a cyclic acid arthydride in order to enhance the sensitivity. The cyclic acid anhydride is not specified, but those described in Japanese Patent Application Laid-Open (KOKAI) No. 80022/1977 (corresponding to U.S. Pat. No. 4,115,128) may be cited as examples. The content of the cyclic acid anhydride is generally not more than 15 wt %, preferably 0.05 to 15 wt %, more preferably 0.1 to 8 wt % based on the total solids of the photosensitive composition.

The photosensitive composition of the present invention is produced by dissolving the above-described components in the following solvent. A photosensitive layer is formed on the substrate by applying the thus-obtained solution on the surface of an appropriate substrate and drying the solution. Thus, a photosensitive lithographic plate is produced by using the photosensitive composition of the present invention.

Examples of the solvent usable when each component of the photosensitive composition of the present invention is dissolved, are cellosolves such as methyl cellosolve, methyl cellosolve acetate, ethyl cellosolve and ethyl cellosolve acetate; ethers and/or esters of diethylene glycol such as methyl carbitol, ethyl carbitol, dimethyl carbitol, diethyl carbitol and methyl carbitol acetate; dimethyl-3-methoxy-1-butanol; propylene glycol monomethyl ether; propylene glycol dimethyl ether; methyl ethyl ketone; formamide; dimethyl sulfoxide; dioxane; acetone; cyclohexanone and trichloroethylene. These solvents may be used either singly or in the form of a mixture.

The photosensitive composition of the present invention may be applied on the surface of a substrate by a conventional method such as spin coating, wire-bar coating, dip coating, air-knife coating, roll coating, blade coating and curtain coating. The amount of coating is different depending upon the purpose of use but, for example, 0.1 to 5.0 g/m² (as a solid content) is preferable. The drying temperature is, for example, 20° to 150° C., preferably 30° to 100° C.

Examples of the base on which a photosensitive layer composed of the photosensitive composition of the present invention is formed, are a metal plate of aluminum, zinc, steel, copper or the like; a metal plate, paper, plastic film and glass plate deposited or plated with chromium, zinc, copper, nickel, aluminum, iron or the like; paper coated with a resin; paper with metal foil such as aluminum foil pasted thereon; and plastic film treated so as to be hydrophillic. Among these, an aluminum plate is preferable. As the substrate of a photosensitive lithographic plate using the photosensitive composition of the present invention, an aluminum plate which is subjected to surface treatment such as graining, anodizing and, if necessary, pore sealing is more preferable. A known method is applicable to such treatment.

A photosensitive lithographic plate using the photosensitive composition of the present invention can be subjected to ordinary development. For example, the plate is exposed to a light source such as an extra-high pressure mercury lamp, a metal halide lamp, a xenone lamp and a tungsten lamp through transparent film, and then developed by various kinds of alkali developer. As a result, only undeveloped area remains on the surface of the substrate, thereby forming a positive-positive relief.

As the alkali developer, aqueous solutions of an alkali metal salt such as sodium hydroxide, potassium hydroxide, sodium carbonate, potassium carbonate, sodium metasilicate, potassium metasilicate, sodium secondary phosphate and sodium tertiary phosphate are usable. The concentration of the alkali metal salt is preferably 0.1 to 20 wt %. It is also possible to add, if necessary, an organic solvent such as an anionic surfactant, an ampholytic surfactant and alcohol to the developer.

The photosensitive composition of the present invention shows a high exposure visibility even at the time of small exposure, and has a high sensitivity, an excellent chemical resistance and a good ball-point pen resistance.

EXAMPLES

The present invention will be explained in more detail hereinunder with reference to the following examples. It is to be understood, however, the present invention is not restricted to the following examples within the scope of the invention.

Production of aluminum plate

After subjecting an aluminum plate (material: AA 1050, temper: H16) of 0.24 mm in thickness to degreasing treatment in 5 wt % of an aqueous sodium hydroxide at a temperature of 60° C. for 1 minute, it was subjected to electrolytic etching treatment in 0.5 mol/liter aqueous hydrochloric acid solution at a temperature of 25° C. and a current density of 60 A/dm² for 30 seconds. Thereafter, the aluminum plate was desmutted in 5 wt % of an aqueous sodium hydroxide at a temperature of 60° C. for 10 seconds, and it was then anodized in 20 wt % of a sulfuric acid solution at a temperature of 20° C. and a current density of 3 A/dm² for 1 minute. Furthermore, the aluminum plate was sealed in hot water of a temperature of 80° C. for 20 seconds, thereby producing an aluminum plate for the substrate of a lithographic plate.

Application of coating solution of photosensitive composition

The coating solution of a photosensitive composition having the following composition was applied on the surface of the thus-obtained aluminum plate by using a spin coater, and the aluminum plate was then dried at a temperature of 90° C. for 4 minutes. Thus, a positive photosensitive lithographic plate was produced. The film thickness of the dried coated film of each sample was 2.2 g/m².

| Composition of photosensitive composition: | |
|---|---|
| (1) The following o-Naphthoquinonediazide compound | 1.8 g |
| (2) s-Triazine compound or similar compound shown in Tables 1 and 2 | 0.07 g |
| (3) Dye (Victoria Pure Blue-BOH, produced by Hodogaya Chemical Co., Ltd.) | 0.07 g |
| (4) Novolak resin shown in Tables 1 and 2 | 4.5 g |
| (5) The following vinyl polymer containing phenolic hydroxyl group | 2.0 g |
| (6) Methyl cellosolve | 100 ml |
| (7) Acid shown in Tables 1 and 2 | 0.1 g |

(1) o-Naphthoquinonediazide compound:

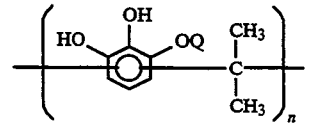

(Mw of the resin before reacting Q = 1500)

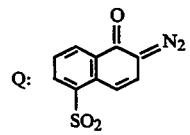

(5) Vinyl polymer containing phenolic hydroxyl group:

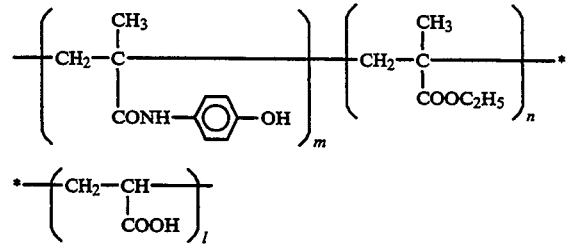

(Mw = 33000, Mw/Mn = 7, m:n:l = 38:60:2)

The thus-obtained photosensitive lithographic plate was exposed to light of 50 to 400 mj/cm² through a positive transparent original while using a metal halide lamp (SPG-1000, produced by Japan Storage Battery Co., Ltd.) as a light source, and the optical density difference (ΔOD) between the exposed area and the unexposed area was measured by a Macbeth reflection densitometer.

The sensitivity was evaluated as follow. The lithography plate was exposed to light of 400 mj/cm² through a gray scale having a density difference of 0.15, and the plate was developed by dish development at a temperature of 25° C. for 45 seconds in a developer (SDR-1, produced by Konica, Co., Ltd.) which was diluted 6 times. The sensitivity was expressed by the gray scale number at which the developed image was completely clear. The larger the number, the higher the sensitivity.

The ball-point pen resistance was evaluated as follows. Lines were drawn on the unexposed area, the image area of the exposed lithographic palte with a ball-point pen (produced by Pilot Pen Co., Ltd.), and thereafter the plate was similarly subjected to development. The degree of erosion to the photosensitive composition of the image area was visually Judged in accordance with the following criteria.

6: Almost no erosion was observed at the drawing area.
4: Slight erosion was observed at the drawing area.
2: Remarkable erosion was observed at the drawing area.

The chemical resistance was evaluated by immersing the developed printed plate in Ultra Plate Cleaner (produced by Dainichiseika Colour and Chemical Mfg. Co., Ltd.) for 1 hour, and the degree of erosion of the drawing area was visually judged in accordance with the following criteria.

10: Very good.
5: The drawing area was considerably damaged and small dots are erased.
0: The drawing area was erased.

The results of these evaluations are collectively shown in Tables 1 and 2.

In Tables 1 and 2, s-triazine compounds or similar compounds 'a', 'b' and 'c' represent the following compounds:

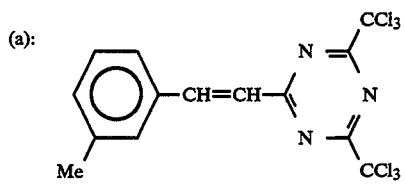

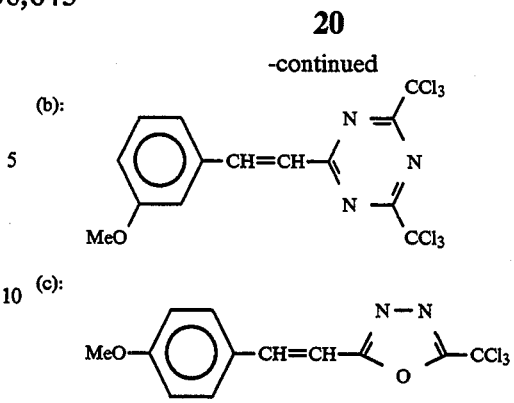

Novolak resins 1 to 4 are compounds produced by copolymerizing phenol, m-cresol, p-cresol and formaldehyde in the presence of oxalic acid as a catalyst. The molar ratio of charged phenol, m-cresol and p-cresol was 20:48:32. As to the novolak resins 1 to 3, after the above-mentioned phnols and formaldehyde were polymerized under heating, they were not cooled but distilled at a temperature of 160° C. under a reduced pressure of about 50 mmHg for 30 minutes, 2 hours and 10 minutes, respectively, whereby the unpolymerized phenols were removed. The ratios of the unpolymerized phenols (phenol, m-cresol and p-cresol) in the novolak resins 1 to 4 measured 4.5 wt %, 2.5 wt %, 7.0 wt % and 10 wt %, respectively, by gel permeation chromatography. The apparatus HLC-8020 (produced by TOSO K. K.) was used for gel permeation chromatography One column PL-gel 15μ (produced by Polymer Laboratories Corp.) of 100 A and three columns PL-gel 15μ (produced by Polymer Laboratories Corp. ) of 50 Å were connected in series, and tetrahydrofuran was used as a carrier solvent at a flow rate of 0.5 ml/min. The differential refractometer attached to the apparatus was used as a detector.

That is, the numerals 1 to 4 represent as follows:

| | |
|---|---|
| 1: Unpolymerized phenols (phenol, m-cresol and p-cresol) | 4.5 wt % |
| 2: Unpolymerized phenols | 2.5 wt % |
| 3: Unpolymerized phenols | 7.0 wt % |
| 4: Unpolymerized phenols | 10 wt % |

Acids a and b represent as follow:
a: sulfuric acid
b: p-toluenesulfonic acid

TABLE 1

| Sample No. | S-Triazine compound or similar compound | Novolak resin | Acid | Vinyl based polymer | Sensitivity (Gray scale number) | ΔOD × 100 | | | | Ball-point pen resistance |
| | | | | | | 50 mJ/cm² | 100 mJ/cm² | 200 mJ/cm² | 400 mJ/cm² | |
|---|---|---|---|---|---|---|---|---|---|---|
| Example 1 | I-13 | 1 | None | Used | 4¼ | 2 | 8 | 18 | 29 | 6 |
| Example 2 | I-17 | 1 | None | Used | 4¼ | 1 | 6 | 17 | 27 | 6 |
| Example 3 | I-14 | 1 | None | Used | 4¼ | 2 | 6 | 18 | 28 | 6 |
| Example 4 | I-21 | 1 | None | Used | 4 | 2 | 7 | 19 | 28 | 6 |
| Example 5 | I-1 | 1 | None | Used | 3¾ | 3 | 11 | 24 | 35 | 4 |
| Example 6 | I-5 | 1 | None | Used | 3¾ | 3 | 10 | 23 | 33 | 5 |
| Example 7 | I-2 | 1 | None | Used | 3¾ | 4 | 9 | 24 | 33 | 4 |
| Example 8 | I-9 | 1 | None | Used | 4 | 2 | 9 | 22 | 31 | 6 |
| Example 9 | I-13 | 2 | None | Used | 4¼ | 2 | 8 | 19 | 29 | 6 |
| Example 10 | I-1 | 2 | None | Used | 3¾ | 3 | 12 | 23 | 35 | 4 |
| Comparative example 1 | a | 1 | None | Used | 4 | 0 | 1 | 10 | 24 | 2 |
| Comparative example 2 | b | 1 | None | Used | 3¾ | 0 | 3 | 12 | 26 | 2 |
| Comparative example 3 | c | 1 | None | Used | 3¾ | 0 | 3 | 14 | 25 | 3 |
| Comparative | I-13 | 3 | None | Used | 4 | 2 | 6 | 17 | 30 | 2 |

TABLE 1-continued

| Sample No. | S-Triazine compound or similar compound | Novolak resin | Acid | Vinyl based polymer | Sensitivity (Gray scale number) | ΔOD × 100 50 mJ/cm² | 100 mJ/cm² | 200 mJ/cm² | 400 mJ/cm² | Ball-point pen resistance |
|---|---|---|---|---|---|---|---|---|---|---|
| example 4 | | | | | | | | | | |
| Comparative example 5 | I-1 | 3 | None | Used | 3½ | 2 | 10 | 24 | 34 | 2 |
| Comparative example 6 | I-13 | 4 | None | Used | 3½ | 2 | 5 | 15 | 30 | 2 |
| Comparative example 7 | I-1 | 4 | None | Used | 3¼ | 1 | 10 | 23 | 35 | 1 |
| Example 11 | I-13 | 1 | a | Used | 4¾ | 4 | 12 | 22 | 33 | 6 |
| Example 12 | I-13 | 1 | b | Used | 4¾ | 4 | 13 | 22 | 32 | 6 |
| Example 13 | I-1 | 1 | a | Used | 4¼ | 7 | 17 | 28 | 36 | 6 |
| Example 14 | I-1 | 1 | b | Used | 4¼ | 6 | 16 | 29 | 35 | 6 |
| Example 15 | I-13 | 2 | a | Used | 4¾ | 5 | 12 | 23 | 32 | 6 |
| Example 16 | I-1 | 2 | a | Used | 4¼ | 6 | 16 | 29 | 36 | 5 |
| Comparative example 8 | a | 1 | a | Used | 4¼ | 1 | 4 | 12 | 25 | 5 |
| Comparative example 9 | a | 1 | b | Used | 4¼ | 1 | 3 | 12 | 26 | 2 |
| Comparative example 10 | b | 1 | a | Used | 4 | 2 | 5 | 15 | 27 | 3 |
| Comparative example 11 | b | 1 | b | Used | 4¼ | 1 | 6 | 14 | 27 | 5 |
| Comparative example 12 | c | 1 | a | Used | 4¼ | 2 | 5 | 16 | 27 | 2 |
| Comparative example 13 | c | 1 | b | Used | 4 | 2 | 4 | 15 | 28 | 2 |
| Comparative example 14 | I-1 | 3 | a | Used | 3¾ | 6 | 16 | 29 | 35 | 2 |
| Comparative example 15 | I-1 | 4 | a | Used | 3¾ | 7 | 15 | 28 | 35 | 1 |
| Comparative example 16 | I-13 | 1 | None | None | 4¼ | 3 | 8 | 19 | 28 | — |
| Comparative example 17 | I-1 | 1 | None | None | 3¾ | 3 | 12 | 25 | 34 | — |
| Comparative example 18 | I-13 | 1 | a | None | 4¾ | 4 | 12 | 23 | 34 | — |
| Comparative example 19 | I-1 | 1 | a | None | 4¼ | 6 | 17 | 29 | 36 | — |

TABLE 2

| Example No. | Chemical resistance |
|---|---|
| Example 1 | 8 |
| Example 5 | 7 |
| Comparative example 16 | 3 |
| Comparative example 17 | 3 |
| Example 11 | 7 |
| Example 13 | 7 |
| Comparative example 18 | 2 |
| Comparative example 19 | 1 |

What is claimed is:

1. A photosensitive composition, comprising in admixture:

(A) 5 to 60 wt % of an o-quinonediazide compound;
(B) 0.05 to 10 wt % of an s-triazine compound represented by the following general formula (I):

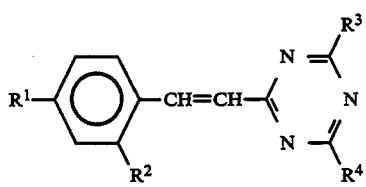

(wherein $R^1$ and $R^2$ each represent one selected from the group consisting of an alkyl group, a substituted alkyl group, an alkoxy group, a substituted alkoxy group and hydrogen atom, and $R^3$ and $R^4$ each represent one selected from the group consisting of a trihaloalkyl group having 1 to 4 carbon atoms and a trihaloalkenyl group having 1 to 4 carbon atoms;

(C) 0.01 to 10 wt % of a dye for changing the color-tone by the interaction with the photodecomposition product of said s-triazine compound;

(D) 30 to 90 wt % of a novolak resin containing less than 5 wt % of unpolymerized phenols; and (E) 1 to 60 wt % of a vinyl-based polymer having at least a phenolic hydroxyl group.

2. The photosensitive composition according to claim 1, wherein said o-quinonediazide compound is an o-naphthoquinonediazide compound.

3. The photosensitive composition according to claim 2, wherein said o-naphthoquinonediazide compound is a reaction product of a compound having an o-naphthoquinonediazide group and an alkali-soluble resin.

4. The photosensitive composition according to claim 2, wherein the condensation ratio of said o-naphthoquinonediazide compound with respect to an OH group of said phenol is 5 to 80%.

5. The photosensitive composition according to claim 1, wherein $R^1$ and $R^2$ each in said s-triazine compound are an alkyl group having 1 to 4 carbon atoms, an alkoxy group having 1 to 4 carbon atoms or a hydrogen atom, and $R^3$ and $R^4$ each are a trichloroalkyl group or tribromoalkyl group both having 1 to 4 carbon atoms or a trichloroalkenyl group or tribromoalkenyl group both having 1 to 4 carbon atoms.

6. The photosensitive composition according to claim 5, wherein said s-triazine compound is selected from the group consisting of 2,4-bis(trichloromethyl)-6-(p-

($C_1$-$C_4$)alkoxystyryl)-s-triazine, 2,4-bis(trichloromethyl)-6-(p-($C_1$-$C_4$)alkylstyryl)-s-triazine, 2,4-bis(trichloromethyl)-6-(o,p-di($C_1$-$C_4$)alkylstyryl)-s-triazine and 2,4- bis(trichloromethyl) 6-(o,p-di($C_1$-$C_4$)alkoxystyryl)-s-triazine.

7. The photosensitive composition according to claim 1, wherein said dye is one selected from the group consisting of diphenylmethane dyes, triphenylmethane dyes, thiazine dyes, oxazine dyes, xanthene dyes, anthraquinone dyes, iminonaphthoquinone dyes, azomethine dyes, arylamine dyes, leuco pigment and mixture thereof.

8. The photosensitive composition according to claim 1, wherein said novolak resin is a resin obtained by the copolymerization of at least one selected from the group consisting of phenol, o-cresol, m-cresol and p-cresol with formaldehyde.

9. The photosensitive composition according to claim 8, wherein said novolak resin is one selected from the group consisting of phenol-formaldehyde resin, m-cresol-formaldehyde resin, o-cresol-formaldehyde resin, phenol-p-cresol-formaldehyde resin, m-cresol-p-cresol-formaldehyde resin, o-cresol-p-cresol-formaldehyde resin, phenol-m-cresol-p-cresol-formaldehyde resin, and phenol-cresol-p-cresol-formaldehyde resin.

10. The photosensitive composition according to claim 1, wherein said novolak resin has a weight-average molecular weight (Mw) of $2.0 \times 10^3$ to $2.0 \times 10^4$ and a number-average molecular weight (Mn) of $7.0 \times 10^2$ to $5.0 \times 10^3$.

11. The photosensitive composition according to claim 1, wherein said vinyl-based polymer has structural units represented by at least one of the following general formulas (II) to (VII):

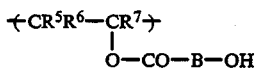  (II)

  (III)

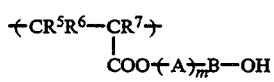  (IV)

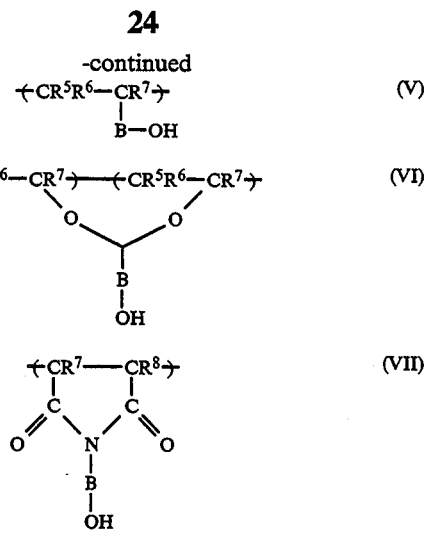

(wherein $R^5$ and $R^6$ each represent a hydrogen atom, an alkyl group or a carboxyl group; $R^7$ represents a hydrogen atom, a halogen atom or an alkyl group; $R^8$ represents a hydrogen atom, an alkyl group, an aryl group or an aralkyl group; A represents an alkylene group which may have a substituent and connects a nitrogen atom or an oxygen atom and an aromatic carbon atom; m is an integer of 0 to 10, and B represents a phenylene group which may have a substituent or a naphthylene group which may have a substituent).

12. The photosensitive composition according to claim 11, wherein said vinyl polymer contains 5 to 70 mol % of said structural units represented by at least one of said formulas (II) to (VII).

13. The photosensitive composition according to claim 1, wherein said vinyl polymer has a weight-average molecular weight (Mw) of $5 \times 10^3$ to $1 \times 10^5$.

14. The photosensitive composition according to claim 1, further comprising not more than 5 wt % of an organic acid or an inorganic acid.

15. The photosensitive composition according to claim 14, wherein the organic acids are sulfonic acids and the inorganic acids are sulfuric acid and phosphoric acid.

16. The photosensitive composition according to claim 1, further comprising not more than 15 wt % of a grease sensitizer.

17. The photosensitive composition according to claim 1, further comprising not more than 15 wt % of a cyclic acid anhydride.

* * * * *